(12) United States Patent
Fukuda et al.

(10) Patent No.: US 8,558,602 B2
(45) Date of Patent: Oct. 15, 2013

(54) SEMICONDUCTOR INTEGRATED CIRCUIT

(75) Inventors: Ryo Fukuda, Yokohama (JP); Masaru Koyanagi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 116 days.

(21) Appl. No.: 12/884,533

(22) Filed: Sep. 17, 2010

(65) Prior Publication Data

US 2011/0128063 A1 Jun. 2, 2011

(30) Foreign Application Priority Data

Dec. 1, 2009 (JP) .................................. 2009-273787

(51) Int. Cl.
*H03L 5/00* (2006.01)

(52) U.S. Cl.
USPC ................................ 327/333; 326/68; 326/81

(58) Field of Classification Search
USPC ............. 327/333; 326/68, 80, 81; 365/189.11
See application file for complete search history.

(56) References Cited

U.S. PATENT DOCUMENTS

| | | | | |
|---|---|---|---|---|
| 5,559,996 | A | * | 9/1996 | Fujioka ........................ 327/333 |
| 7,061,299 | B2 | * | 6/2006 | Khan et al. .................... 327/333 |
| 2005/0007176 | A1 | * | 1/2005 | Seki ............................. 327/333 |

FOREIGN PATENT DOCUMENTS

| | | |
|---|---|---|
| JP | 06-209256 | 7/1994 |
| JP | 2001-326570 | 11/2001 |
| JP | 2004-363843 | 12/2004 |
| JP | 2006-101146 | 4/2006 |
| JP | 2006-333466 | 12/2006 |

OTHER PUBLICATIONS

Office Action Mailed May 21, 2013, in Japanese Patent Application No. 2009-273787, filed Dec. 1, 2009, with English-language Translation, 5 pages.

\* cited by examiner

*Primary Examiner* — Long Nguyen

(74) *Attorney, Agent, or Firm* — Oblon, Spivak, McClelland, Maier & Neustadt, L.L.P.

(57) ABSTRACT

According to one embodiment, a semiconductor integrated circuit includes first and second level shift circuits. The first level shifter includes a plurality of transistors and is connected to a power source voltage supply node of a first power source system and to which a first signal of a second power source system and a level inversion signal of the first signal are input. The second level shifter includes a plurality of transistors and is connected to the power source voltage supply node of the first power source system and to which the level inversion signal of the first signal of the second power source system and an output signal of the first level shifter are input. The first and second level shifters have substantially the same circuit configuration and driving abilities of corresponding ones of the transistors in the first and second level shifters are substantially set equal.

19 Claims, 5 Drawing Sheets

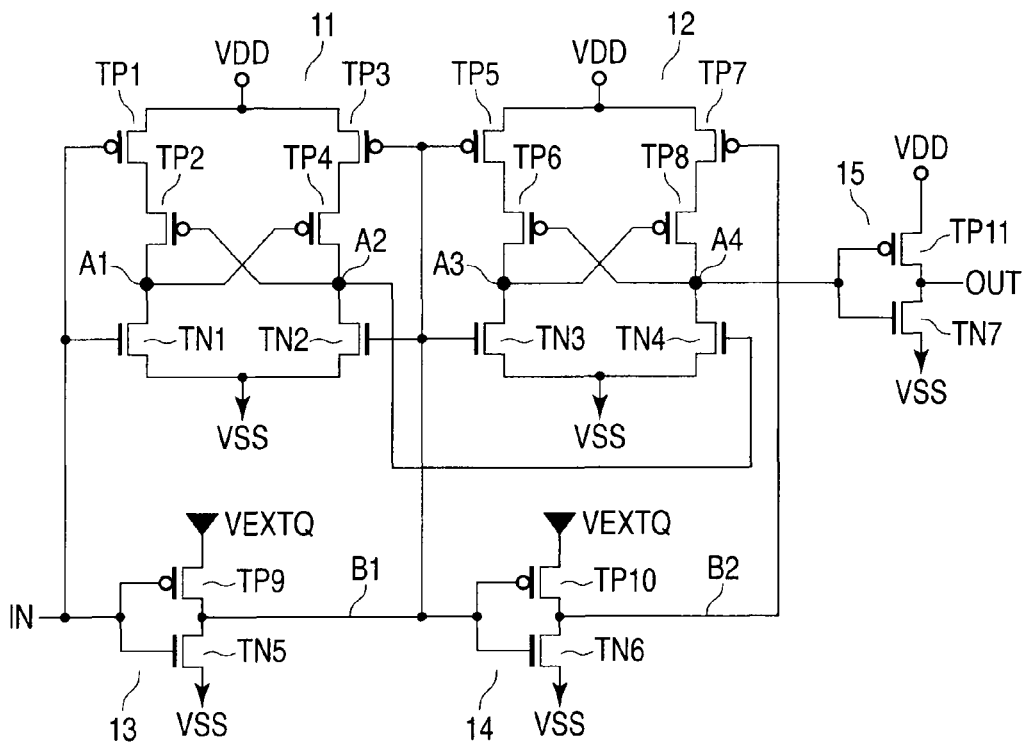
F I G. 1
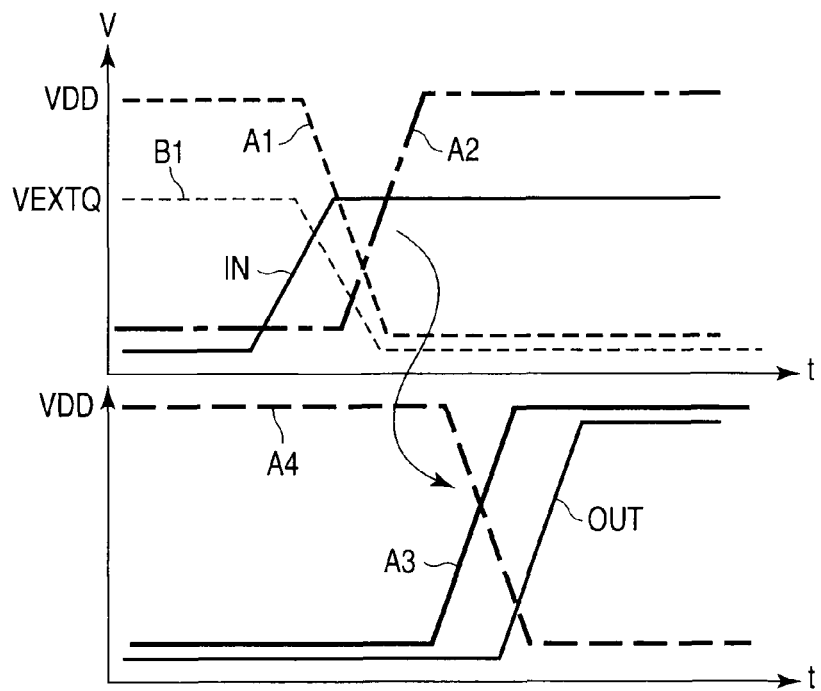
F I G. 2

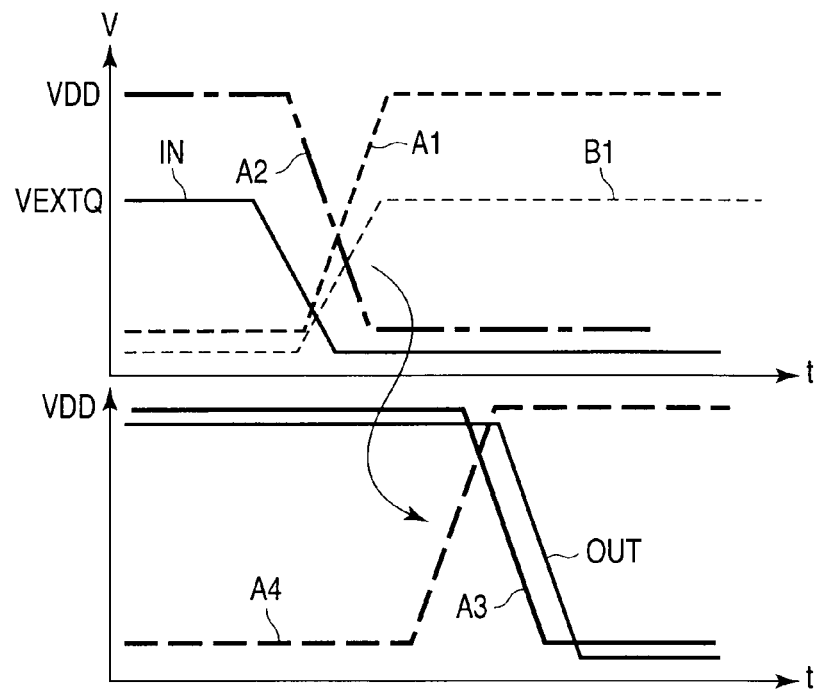
F I G. 3
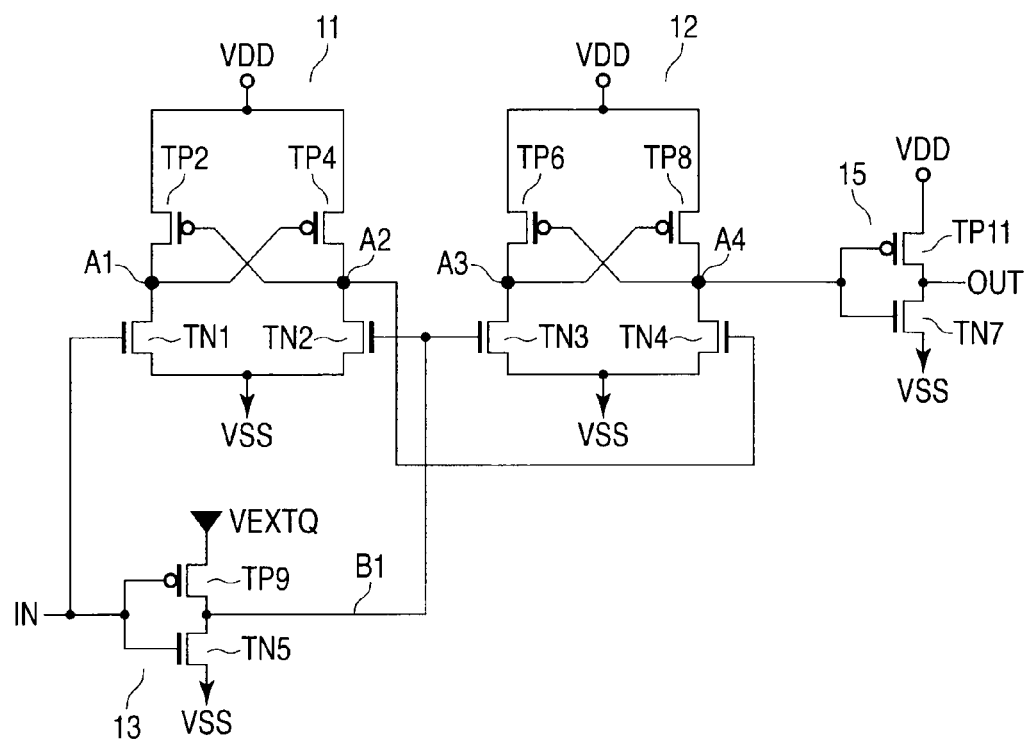
F I G. 4

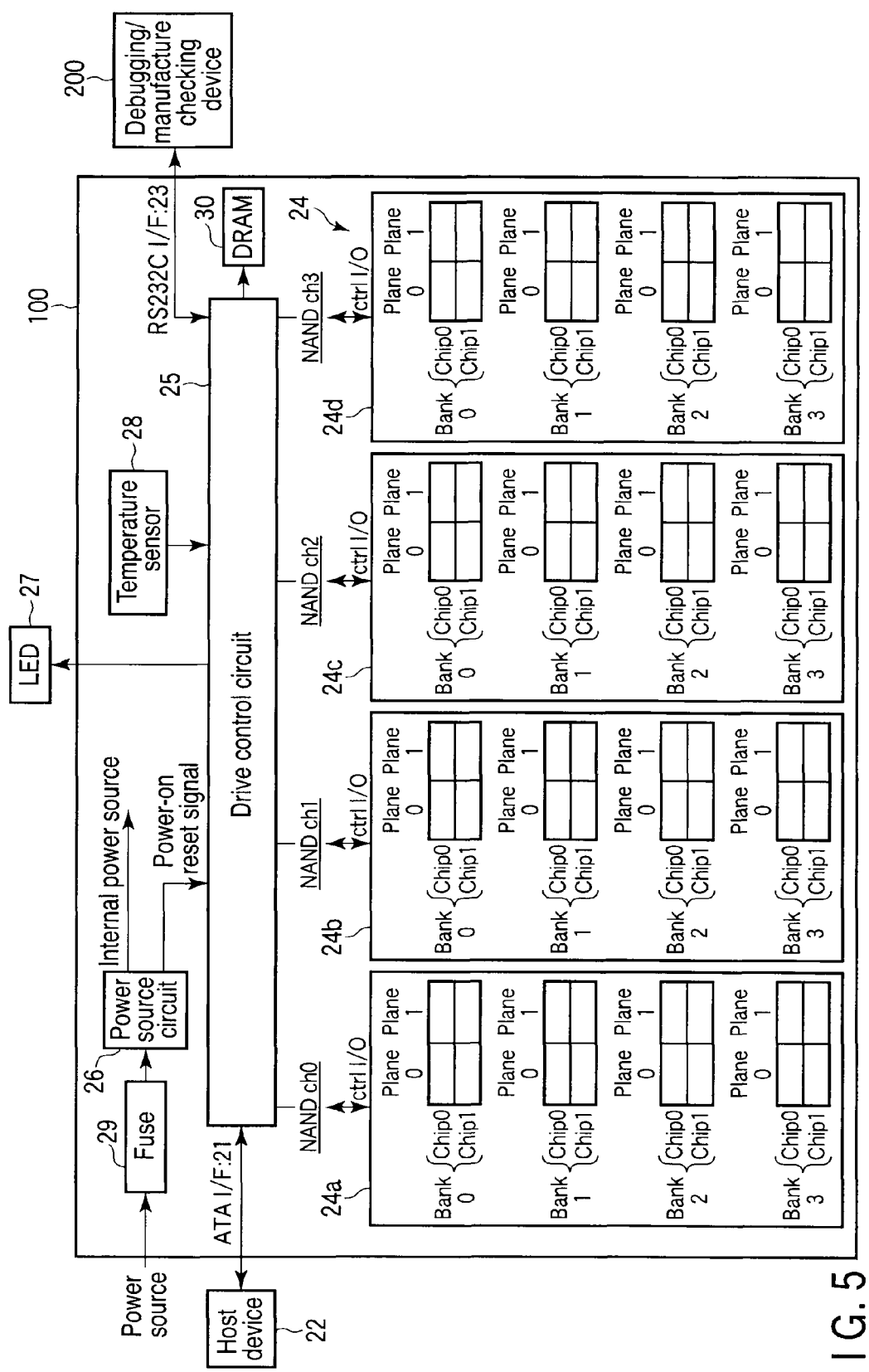
F I G. 5

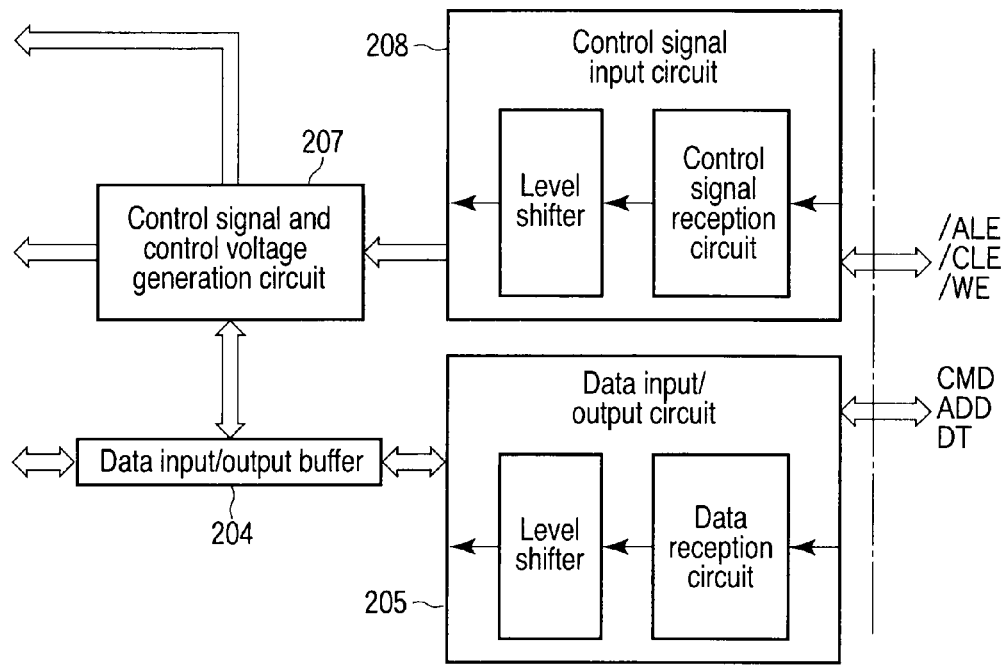
F I G. 7
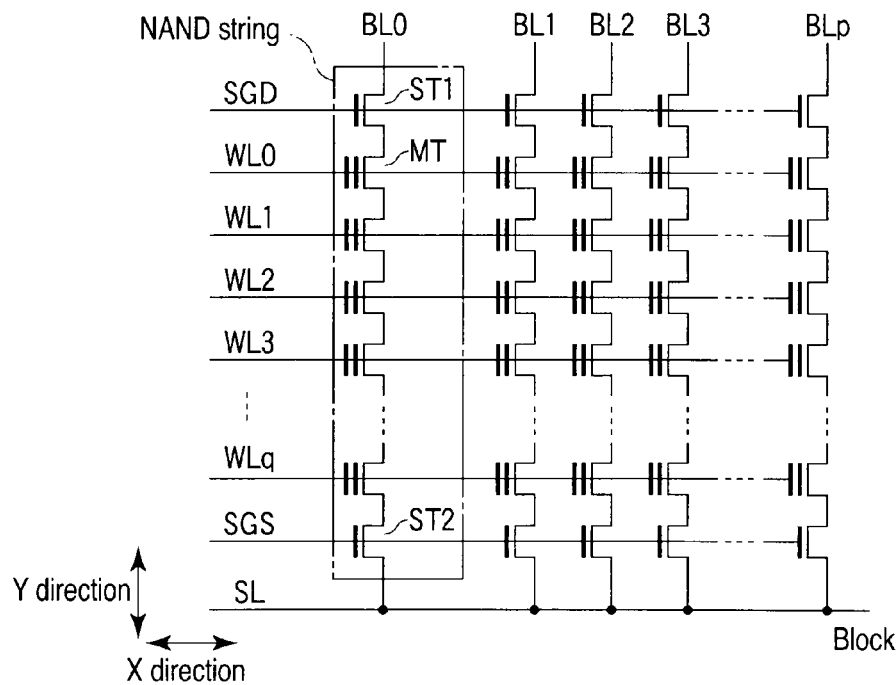
F I G. 8

US 8,558,602 B2

1

SEMICONDUCTOR INTEGRATED CIRCUIT

CROSS-REFERENCE TO RELATED APPLICATIONS

This application is based upon and claims the benefit of priority from Japanese Patent Application No. 2009-273787, filed Dec. 1, 2009; the entire contents of which are incorporated herein by reference.

FIELD

Embodiments described herein relate generally to a semiconductor integrated circuit including a level shift circuit that is provided between circuits of different power source systems and shifts the level of a signal.

BACKGROUND

In a semiconductor integrated circuit chip, a power source voltage different from that of an external I/O is often used for low power consumption. On the other hand, an external input reception circuit in the semiconductor integrated circuit chip often uses the same power source voltage as that of the external I/O. Therefore, in the semiconductor integrated circuit chip, it is required to convert a voltage of a signal in the chip by use of a level shift circuit.

The conventional level shift circuit that level-shifts a signal of a VEXTQ (external) power source system to a signal of a VDD (internal) power source system includes a level shifter of a VDD power source system, an inverter of a VEXTQ power source system and an inverter of a VDD power source system.

The level shifter includes an input-side circuit provided between a VDD power source voltage supply node and a VSS ground voltage supply node and an output-side circuit provided between the VDD power source voltage supply node and the VSS ground voltage supply node. The input-side circuit includes first and second PMOS transistors and an NMOS transistor serially connected in a direction from the VDD power source voltage supply node to the VSS ground voltage supply node. The common connection drain terminal of the drain terminal of the second PMOS transistor and the drain terminal of the NMOS transistor forms an output node of the input-side circuit. Input signal IN is input to the gates of the first PMOS transistor and the NMOS transistor. Input signal IN is also input to the gate of the inverter of the VEXTQ power source system. The output-side circuit of the level shifter has the same configuration as that of the input-side circuit and includes first and second PMOS transistors and an NMOS transistor serially connected in a direction from the VDD power source voltage supply node to the VSS ground voltage supply node. The common connection drain terminal of the drain terminal of the second PMOS transistor and the drain terminal of the NMOS transistor forms an output node of the output-side circuit. An output signal (a level inversion signal of input signal IN) from the inverter of the VEXTQ power source system is input to the gates of the first PMOS transistor and the NMOS transistor of the output-side circuit. The gate of the second PMOS transistor of the input-side circuit and the gate of the second PMOS transistor of the output-side circuit are cross-coupled. That is, the gate of the second PMOS transistor of the input-side circuit is connected to the drain terminal of the second PMOS transistor of the output-side circuit and the gate of the second PMOS transistor of the output-side circuit is connected to the drain terminal of the second PMOS transistor of the input-side circuit.

2

In the conventional level shift circuit, a time required for input signal IN to be input and output, that is, transition time is different when the output node of the output-side circuit of the level shifter is set to "H" and when it is set to "L". Specifically, when input signal IN falls to "L", the output node of the inverter becomes "H" and the NMOS transistor of the output-side circuit of the level shifter is turned on to set the output node of the output-side circuit to "L", the transition time is short. On the other hand, when input signal IN rises to "H" and the output node of the output-side circuit of the level shifter is set to "H", the PMOS transistor of the output-side circuit is not turned on if the output node of the input-side circuit is lowered towards "L" to some extent. Therefore, when the output node of the output-side circuit is set to "H", the transition time becomes slightly longer. As a result, the transition time of output signal OUT output from the inverter of the VDD power source system becomes different.

Thus, in the conventional level shift circuit, a difference occurs in the transition time at the rise time and fall time of the input signal. If the transition time of a signal of the level shift circuit is different at the rise time and fall time of the input signal, it becomes necessary to set an excessive margin of setup/hold or the like in the I/O of an external device and the performance of the external device is degraded.

In Jpn. Pat. Appln. KOKAI Publication No. 2004-363843, a level shift circuit that enhances the performance of a conversion operation by connecting a large number of level shifters to a large number of different power source voltages and gradually shifting the signal level to decrease a conversion potential difference between the respective level shifters is described.

BRIEF DESCRIPTION OF THE DRAWINGS

FIG. 1 is a circuit diagram showing the configuration of a level shift circuit provided on a semiconductor integrated circuit according to an embodiment.

FIG. 2 is a waveform diagram showing potential variations of main portions of the level shift circuit of FIG. 1.

FIG. 3 is a waveform diagram showing potential variations of the main portions of the level shift circuit of FIG. 1.

FIG. 4 is a circuit diagram showing a modification of the level shift circuit of FIG. 1.

FIG. 5 is a block diagram showing one configuration example of a solid state drive (SSD) to which a semiconductor integrated circuit according to the embodiment is applied.

FIG. 7 is a diagram showing one portion of the function block shown in FIG. 6.

FIG. 8 is a circuit diagram showing a configuration example of one physical block contained in one NAND memory chip of the SSD shown in FIG. 5.

DETAILED DESCRIPTION

Figure 6:
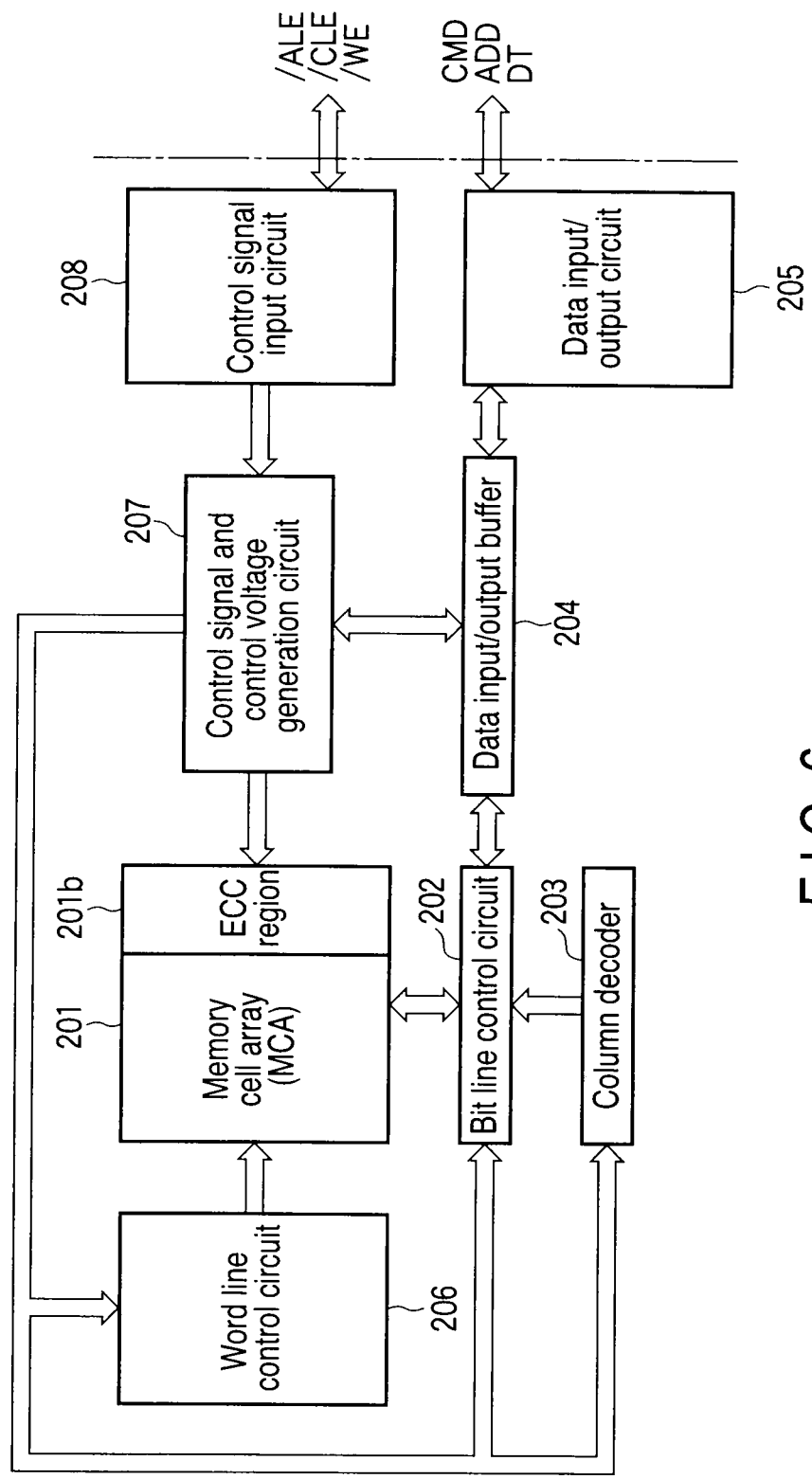
FIG. 6 is a function block diagram showing an example of a NAND flash memory contained in one NAND memory chip of the SSD shown in FIG. 5.

In general, according to one embodiment, a semiconductor integrated circuit includes a first level shifter and a second level shifter. The first level shifter includes a first transistor, a second transistor, a third transistor and a fourth transistor. The first transistor is of a first channel type and has a source terminal connected to a power source voltage supply node of a first power source system. The second transistor is of the first channel type and has a source terminal connected to the power source voltage supply node of the first power source system, a drain terminal connected to a gate terminal of the first transistor and a gate terminal connected to a drain terminal of the first transistor. The third transistor is of a second channel type and has a drain terminal connected to the drain terminal of the first transistor, a source terminal connected to a ground voltage supply node and a gate terminal to which a first signal of a second power source system is input. The fourth transistor is of the second channel type and has a drain terminal connected to the drain terminal of the second transistor, a source terminal connected to the ground voltage supply node and a gate terminal to which an inversion signal of the first signal is input. The second level shifter includes a fifth transistor, a sixth transistor, a seventh transistor and an eighth transistor. The fifth transistor is of the first channel type and has a source terminal connected to the power source voltage supply node of the first power source system. The sixth transistor is of the first channel type and has a source terminal connected to the power source voltage supply node of the first power source system, a drain terminal connected to a gate terminal of the fifth transistor and a gate terminal connected to a drain terminal of the fifth transistor. The seventh transistor is of a second channel type and has a drain terminal connected to the drain terminal of the fifth transistor, a source terminal connected to the ground voltage supply node and a gate terminal to which a second signal is input. The eighth transistor is of the second channel type and has a drain terminal connected to the drain terminal of the sixth transistor, a source terminal connected to the ground voltage supply node and a gate terminal to which a signal of a common drain terminal of the drain terminal of the second transistor and the drain terminal of the fourth transistor is input.

Embodiments will be described hereinafter with reference to the accompanying drawings.

FIG. 1 is a circuit diagram showing the configuration of a level shift circuit provided on a semiconductor integrated circuit according to an embodiment. The level shift circuit level-shifts a signal of a VEXTQ (external) power source system to a signal of a VDD (internal) power source system and, for example, it is assumed that VEXTQ<VDD.

In FIG. 1, 11 denotes a first level shifter of the VDD power source system, 12 a second level shifter of the VDD power source system, 13 an inverter of the VEXTQ power source system, 14 an inverter of the VEXTQ power source system and 15 an inverter of the VDD power source system.

The inverter 13 includes a PMOS transistor TP9 and an NMOS transistor TN5 and a power source voltage of the VEXTQ power source system is applied thereto. Input signal IN of the VEXTQ power source system is input to the inverter 13. The inverter 14 includes a PMOS transistor TP10 and an NMOS transistor TN6 and a power source voltage of the VEXTQ power source system is applied thereto. A signal of output node B1 of the inverter 13 is input to the inverter 14. Therefore, the signal of output node B2 of the inverter 14 corresponds to a non-inverted signal of input signal IN.

The first level shifter 11 includes four PMOS transistors TP1, TP2, TP3, TP4 and two NMOS transistors TN1, TN2. The source terminal of the PMOS transistor TP1 is connected to a power source voltage supply node of the VDD power source system. The drain terminal of the PMOS transistor TP1 is connected to the source terminal of the PMOS transistor TP2 and input signal IN is input to the gate terminal thereof. The source terminal of the PMOS transistor TP3 is connected to the power source voltage supply node of the VDD power source system. The drain terminal of the PMOS transistor TP3 is connected to the source terminal of the PMOS transistor TP4 and a signal of output node B1 of the inverter 13 is input to the gate terminal thereof. The gate terminal of the PMOS transistor TP2 is connected to the drain terminal of the PMOS transistor TP4, the gate terminal of the PMOS transistor TP4 is connected to the drain terminal of the PMOS transistor TP2 and the gate terminals and drain terminals of both of the PMOS transistors TP2, TP4 are cross-coupled.

The drain terminal of the NMOS transistor TN1 is connected to the drain terminal of the PMOS transistor TP2, the source terminal thereof is connected to a supply node of ground voltage VSS and input signal IN is input to the gate terminal thereof. The drain terminal of the NMOS transistor TN1 and the drain terminal of the PMOS transistor TP2 form a common drain terminal and is used as one output node A1 of the first level shifter 11. The drain terminal of the NMOS transistor TN2 is connected to the drain terminal of the PMOS transistor TP4, the source terminal thereof is connected to the supply node of ground voltage VSS and a signal of output node B1 of the inverter 13 is input to the gate terminal thereof. The drain terminal of the NMOS transistor TN2 and the drain terminal of the PMOS transistor TP4 form a common drain terminal and is used as the other output node A2 of the first level shifter 11.

The second level shifter 12 has the same circuit configuration as that of the first level shifter 11 and includes four PMOS transistors TP5, TP6, TP7, TP8 and two NMOS transistors TN3, TN4. The source terminal of the PMOS transistor TP5 is connected to a power source voltage supply node of the VDD power source system. The drain terminal of the PMOS transistor TP5 is connected to the source terminal of the PMOS transistor TP6 and a signal of output node B1 of the inverter 13 is input to the gate terminal thereof. The source terminal of the PMOS transistor TP7 is connected to the power source voltage supply node of the VDD power source system. The drain terminal of the PMOS transistor TP7 is connected to the source terminal of the PMOS transistor TP8 and a signal of output node B2 of the inverter 14 is input to the gate terminal thereof. The gate terminal of the PMOS transistor TP6 is connected to the drain terminal of the PMOS transistor TP8, the gate terminal of the PMOS transistor TP8 is connected to the drain terminal of the PMOS transistor TP6 and the gate terminals and drain terminals of both of the PMOS transistors TP6, TP8 are cross-coupled.

The drain terminal of the NMOS transistor TN3 is connected to the drain terminal of the PMOS transistor TP6, the source terminal thereof is connected to a supply node of ground voltage VSS and a signal of output node B1 of the inverter 13 is input to the gate terminal thereof. The common drain terminal of the NMOS transistor TN3 and the PMOS transistor TP6 is used as one output node A3 of the second level shifter 12. The drain terminal of the NMOS transistor TN4 is connected to the drain terminal of the PMOS transistor TP8, the source terminal thereof is connected to the supply node of ground voltage VSS and a signal of output node A2 of the first level shifter 11 is input to the gate terminal thereof. The drain terminal of the NMOS transistor TN4 and the drain terminal of the PMOS transistor TP8 form a common drain terminal and is used as the other output node A4 of the second level shifter 12.

The inverter 15 includes a PMOS transistor TP11 and NMOS transistor TN7 and a power source voltage of the VDD power source system is supplied thereto. A signal of output node A4 of the second level shifter 12 is input to the inverter 15 and the inverter 15 waveforms the signal and outputs signal OUT.

In the level shifters 11, 12, for example, the channel widths of corresponding transistors in the respective circuit configurations are made equal to set the driving abilities thereof equal. That is, the driving abilities of the PMOS transistors TP1, TP3 of the level shifter 11 are set equal to those of the PMOS transistors TP5, TP7 of the level shifter 12, the driving abilities of the PMOS transistors TP2, TP4 of the level shifter 11 are set equal to those of the PMOS transistors TP6, TP8 of the level shifter 12 and the driving abilities of the NMOS transistors TN1, TN2 of the level shifter 11 are set equal to those of the NMOS transistors TN3, TN4 of the level shifter 12.

The functions of the PMOS transistors TP1, TP3 of the first level shifter 11 and the PMOS transistors TP5, TP7 of the second level shifter 12 are simply explained here. The PMOS transistors TP1, TP3 are provided to permit an output signal of the level shifter 11 to be easily inverted when a potential difference occurs between VDD and VEXTQ. Likewise, the PMOS transistors TP5, TP7 are provided to permit an output signal of the level shifter 12 to be easily inverted when a potential difference occurs between VDD and VEXTQ. For example, when output node A1 of the first level shifter 11 is lowered from "H" to "L", the PMOS transistor TP1 is cut off since input signal IN is "H". When the potential of node A1 is discharged in a VSS direction by means of the NMOS transistor TN1, the PMOS transistor TP1 will not prevent the discharging operation and node A1 tends to be inverted to "L".

Next, the operation of the level shift circuit of FIG. 1 is explained with reference to the waveform diagrams of FIG. 2 and FIG. 3. FIG. 2 is a waveform diagram showing potential variations of main portions of the level shift circuit of FIG. 1 when input signal IN changes from "L" to "H" and FIG. 3 is a waveform diagram showing potential variations of the main portions of the level shift circuit of FIG. 1 when input signal IN changes from "H" to "L". FIG. 2 and FIG. 3 respectively show input signals IN, output signals OUT and the potentials of nodes A1 to A4 and node B1.

When input signal IN is set in an "L" level state, the NMOS transistor TN1 is set in the off state and the NMOS transistor TN2 is set in the on state in the first level shifter 11 since a signal of output node B1 of the inverter 13 is set in an "H" state. Therefore, a signal of output node A1 is set in the "H" state and a signal of output node A2 is set in the "L" level state. On the other hand, in the second level shifter 12, the NMOS transistor TN3 is set in the on state and the NMOS transistor TN4 is set in the off state. Therefore, a signal of output node A3 is set in the "L" state and a signal of output node A4 is set in the "H" state. Output signal OUT of the inverter 15 is set in the "L" state.

As shown in FIG. 2, when input signal IN changes from "L" to "H", output node A1 is inverted to "L" and output node A2 is inverted to "H" since the NMOS transistor TN1 is turned on and the NMOS transistor TN2 is turned off in the first level shifter 11. A signal of output node B1 of the inverter 13 is inverted to "L". In the second level shifter 12, since the NMOS transistor TN3 is turned off and the NMOS transistor TN4 is turned on, output node A3 is inverted to "H" and output node A4 is inverted to "L". Therefore, output signal OUT of the inverter 15 to which a signal of output node A4 is input is inverted to "H".

Further, since a signal of output node B1 of the inverter 13 is set in the "L" state when input signal IN is set in the "H" state, the NMOS transistor TN1 is set in the on state and the NMOS transistor TN2 is set in the off state in the first level shifter 11. Therefore, a signal of output node A1 is set in the "L" state and a signal of output node A2 is set in the "H" state. In the second level shifter 12, the NMOS transistor TN3 is set in the off state and the NMOS transistor TN4 is set in the on state. Therefore, a signal of output node A3 is set in the "H" state and a signal of output node A4 is set in the "L" state. Output signal OUT of the inverter 15 is set in the "H" state.

As shown in FIG. 3, since the NMOS transistor TN1 is turned off and the NMOS transistor TN2 is turned on in the first level shifter 11 when input signal IN changes from "H" to "L", output node A1 is inverted to "H" and output node A2 is inverted to "L". A signal of output node B1 of the inverter 13 is inverted to "H". In the second level shifter 12, since the NMOS transistor TN3 is turned on and the NMOS transistor TN4 is turned off, output node A3 is inverted to "L" and output node A4 is inverted to "H". Therefore, output signal OUT of the inverter 15 to which a signal of output node A4 is input is inverted to "L".

The transition time of input/output of the level shifters 11 and 12 is explained below. When input signal IN changes from "L" to "H" as shown in the waveform diagram of FIG. 2, the NMOS transistor TN1 is turned on and the potential of output node A1 starts to be lowered in the level shifter 11. The PMOS transistor TP4 is not turned on until the potential of output node A1 is lowered to some extent. Therefore, in a case where a signal of output node A2 is set to "H" after input signal IN changes from "L" to "H", transition time (t1) corresponding to the above operation is required. Further, after a signal of output node A2 is set to "H", the NMOS transistor TN4 is turned on and a signal of output node A4 is set to "L" in the second level shifter 12. The above operation also requires corresponding transition time (t2).

Further, if input signal IN changes from "H" to "L" as shown in the waveform diagram of FIG. 3, the NMOS transistor TN2 is turned on and a signal of output node A2 is set to "L" in the first level shifter 11. The above operation requires corresponding transition time (t3). Further, when a signal of output node B1 of the inverter 13 is set to "H", the NMOS transistor TN3 is turned on and the potential of output node A3 starts to be lowered in the second level shifter 12. The PMOS transistor TP8 is not turned on until the potential of output node A3 is lowered to some extent. Therefore, in a case where a signal of output node A4 is set to "H" after a signal of output node B1 of the inverter 13 is set to "H", transition time (t4) corresponding to the above operation is required. Since the first and second level shifters 11, 12 have the same circuit configuration and the driving abilities of the corresponding transistors are equal, the transition times (t1) and (t4) are substantially equal to each other and the transition times (t2) and (t3) are substantially equal to each other. As a result, in the level shift circuit of this embodiment, a difference in the transition time at the rise time and fall time of input signal IN can be made small.

In the level shift circuit shown in FIG. 1, the PMOS transistors TP1, TP3 in the first level shifter 11 and the PMOS transistors TP5, TP7 in the second level shifter 12 can be omitted. At this time, the inverter 14 can also be omitted. If the PMOS transistors TP1, TP3, TP5, TP7 are omitted, the source terminals of the PMOS transistors TP2, TP4 in the first level shifter 11 and the PMOS transistors TP6, TP8 in the second level shifter 12 may be connected to a power source voltage supply node of the VDD power source system.

FIG. 4 is a modification of the level shift circuit of FIG. 1 and shows a level shift circuit obtained by omitting the PMOS transistors TP1, TP3, TP5, TP7 and inverter circuit 14 as described above. Also, in this modification, the same effect as that of the level shift circuit shown in FIG. 1 can be attained.

FIG. 5 is a block diagram showing a configuration example of a solid state drive (SSD) to which a semiconductor integrated circuit including the level shift circuit of FIG. 1 or FIG. 4 is applied. The SSD is formed by, for example, using a NAND flash memory and is developed as a substitution of a hard disk device. An SSD 100 is connected to a host device (that is simply referred to as a host) 22 such as a CPU core or personal computer via a memory connection interface such as an ATA interface (ATA I/F) 21 and functions as an external memory of the host 22. Further, the SSD 100 can transfer data with respect to a debugging/manufacture checking device 200 via a communication interface 23 such as an RS232C interface (RS232C I/F).

The SSD 100 includes a NAND flash memory (that is hereinafter referred to as a NAND memory) 24 as a nonvolatile semiconductor memory, a drive control circuit 25 as a controller, a DRAN 30 as a volatile semiconductor memory, a power source circuit 26, state display LED 27, a temperature sensor 28 that detects an internal temperature of the drive control circuit 25 and a fuse 29.

The power source circuit 26 generates a plurality of different internal DC power source voltages from an external DC power source voltage supplied from a power source circuit on the host 22 side and supplies the respective internal DC power source voltages to the respective circuits in the SSD 100. Further, the power source circuit 26 detects a rise of the external power source voltage, generates a power-on reset signal and supplies the same to the drive control circuit 25.

The fuse 29 is provided between the power source circuit on the host 22 side and the power source circuit 26 inside the SSD 100. When an overcurrent is supplied from the external power source circuit, the fuse 29 is cut off to prevent the internal circuits from performing erroneous operations.

For example, the NAND memory 24 includes four parallel operation elements 24a, 24b, 24c, 24d that perform parallel operations and the parallel operation elements 24a, 24b, 24c, 24d are connected to the drive control circuit 25 via channels ch0, ch1, ch2, ch3, respectively. Each of the parallel operation elements 24a to 24d includes a plurality of banks capable of bank interleaving. That is, for example, each of the parallel operation elements includes four banks Bank0, Bank1, Bank2, Bank3, and each bank includes a plurality of NAND memory chips, for example, two memory chips Chip0, Chip1.

Each memory chip is divided into two regions (districts), plane 0 and plane 1, each including a plurality of physical blocks, for example. The plane 0 and plane 1 include peripheral circuits, for example, row decoders, column decoders, page buffers, data caches (not shown) and the like that are independent from one another and the erase/write/read operations can be simultaneously performed for the plane 0 and plane 1 by using a double-speed mode.

Thus, the respective NAND memory chips of the NAND memory 24 can perform the parallel operations by means of a plurality of channels. Further, the bank interleave operation by means of a plurality of banks, the interleave operation of a plurality of chips in the same bank and the parallel operation in the double-speed mode by use of a plurality of planes can be performed. In this case, each memory chip may have a configuration that is divided into two or more planes or that is not divided at all.

The DRAM 30 functions as a data transfer cache and work area memory between the host 22 and the NAND memory 24. For example, the content stored in the work area memory of the DRAM 30 may include log information indicating that each type of management table stored in the NAND memory 24 has an alteration difference of the management table or a master table (snap shot) developed at the start time.

A nonvolatile random access memory such as an FeRAM (Ferroelectric Random Access Memory), MRAM (Magnetoresistive Random Access Memory) or PRAM (Phase change Random Access Memory) can be used instead of the DRAM 30. If the nonvolatile random access memory is used, a portion or all of the operations of saving the various management tables in the NAND memory 24 at the power-off time can be omitted.

The drive control circuit 25 controls data transfer between the host 22 and the NAND memory 24 via the DRAM 30 and controls the respective constituents of the SSD 100. Further, the drive control circuit 25 also has a function of supplying a status display signal to the state display LED 27 and supplying a reset signal and clock signal to the respective portions in the drive control circuit 25 and SSD 100 in response to a power-on reset signal from the power source circuit 26.

Each of the NAND memory chips is formed by arranging a plurality of physical blocks each of which is set as the data erase unit.

FIG. 6 is a function block diagram showing an example of a NAND flash memory contained in one NAND memory chip in the SSD 100 shown in FIG. 5.

A memory cell array 201 is formed by arranging electrically data rewritable memory cells formed of, for example, EEPROM cells in a matrix form and is connected to a plurality of bit lines, a plurality of word lines and one common source line. The memory cell array 201 is connected to a bit line control circuit 202 that controls the bit lines and a word line control circuit 206 that controls the word lines.

The bit line control circuit 202 reads data of a memory cell of the memory cell array 201 via the bit line, detects the state of the memory cell of the memory cell array 201 via the bit line and writes data in the memory cell by applying a write control voltage to the memory cell of the memory cell array 201 via the bit line. The bit line control circuit 202 is connected to a column decoder 203 and data input/output buffer 204.

A data storage circuit (not shown) in the bit line control circuit 202 is selected by means of the column decoder 203. Data read from the memory cell to the data storage circuit is output to the exterior from the data input/output circuit 205 via the data input/output buffer 204. The data input/output circuit 205 is connected to the drive control circuit 25 (FIG. 5) arranged outside the memory chip.

The drive control circuit 25 receives data output from the data input/output circuit 205. Further, the drive control circuit 25 outputs various commands CMD, address ADD and data DT used to control the operation of the NAND flash memory. Write data input from the drive control circuit 25 to the data input/output circuit 205 is supplied to the data storage circuit in the bit line control circuit 202 that is selected by means of the column decoder 203 via the data input/output buffer 204 and the command and address are supplied to a control signal and control voltage generation circuit 207.

The word line control circuit 206 is connected to the memory cell array 201. The word line control circuit 206 selects a word line in the memory cell array 201 and applies a voltage required for reading, writing or erasing to the selected word line.

The memory cell array 201, bit line control circuit 202, column decoder 203, data input/output buffer 204 and word line control circuit 206 are connected to the control signal and control voltage generation circuit 207 and are controlled by the control signal and control voltage generation circuit 207.

The control signal and control voltage generation circuit 207 is connected to a control signal input circuit 208 and controlled by various control signals such as ALE (address-latch-enable), CLE (command-latch-enable) and WE (write-enable) input from the drive control circuit 25 via the control signal input circuit 208 and command CMD input from the drive control circuit 25 via the data input/output circuit 205 and data input/output buffer 204.

The control signal and control voltage generation circuit 207 generates a word line drive voltage and bit line drive voltage at the data write time and also generates a voltage to be supplied to a well. The control signal and control voltage generation circuit 207 includes a booster circuit such as a charge pump circuit to generate a program voltage, read voltage and erase voltage.

Further, the control signal and control voltage generation circuit 207 can change the level of a read voltage to be generated. That is, the control signal and control voltage generation circuit 207 has a function of shifting a voltage applied to a word line in a (+) direction or (−) direction at the read operation time in response to various control signals input via the control signal input circuit 208 and command CMD input via the data input/output circuit 205 and data input/output buffer 204.

The bit line control circuit 202, column decoder 203, word line control circuit 206 and control signal and control voltage generation circuit 207 form a write circuit and read circuit.

The memory cell array 201 includes a storage area 201b that stores an ECC (Error Correction Code) in addition to a storage area used to store main data.

As shown in FIG. 7, the level shift circuit shown in FIG. 1 and FIG. 4 is provided in the data input/output circuit 205 and control signal input circuit 208 of the NAND memory chip shown in FIG. 6 and is provided in the succeeding stage of an external input signal reception circuit that receives a control signal and data supplied from the chip exterior as an external input signal.

FIG. 8 is a circuit diagram showing a configuration example of one physical block contained in one NAND memory chip of the SSD shown in FIG. 5. The physical block includes (p+1) NAND strings sequentially arranged in an X direction (p is an integral number not smaller than 0). Select transistors ST1, ST2 are respectively provided at one end and at the other end of each NAND string. The drains of the select transistors ST1 of the (p+1) NAND strings are respectively connected to bit lines BL0 to BLp and the gates thereof are commonly connected to a select gate line SGD. Further, the sources of the select transistors ST2 are commonly connected to a source line SL and the gates thereof are commonly connected to a select gate line SGS.

Each memory cell transistor (or each memory cell) MT is formed by a MOSFET (Metal Oxide Semiconductor Field Effect Transistor) having a stacked gate structure formed on a semiconductor substrate. The stacked gate structure includes a charge storage layer (floating gate electrode) formed above the semiconductor substrate with a gate insulating film disposed therebetween and a control gate electrode formed above the charge storage layer with a gate-gate insulating film disposed therebetween. The threshold voltage of the memory cell transistor MT varies according to the number of electrons stored in the floating gate electrode and the memory cell stores data according to a difference in the threshold voltage. The memory cell transistor MT may be formed to store one bit or multi-value data (data of two or more bits).

Further, the memory cell transistor MT is not limited to the structure having the floating gate electrode but may have a structure such as a MONOS (Metal-Oxide-Nitride-Oxide-Silicon) structure in which the threshold voltage may be adjusted by trapping electrons in the interface of the nitride film used as a charge storage layer. Likewise, the memory cell transistor MT of the MONOS structure may be formed to store one bit or multi-value data (data of two or more bits).

The (q+1) memory cell transistors MT in each NAND string are arranged with the current paths thereof serially connected between the source of the select transistor ST1 and the drain of the select transistor ST2. That is, a plurality of memory cell transistors MT are serially connected in a Y direction while every adjacent two of them commonly use a diffusion region (source region or drain region).

In the respective NAND strings, the control gate electrodes of the memory cell transistors MT are respectively connected to word lines WL0 to WLq in an order from the memory cell transistors MT that are arranged in the nearest positions of the bit lines BL0 to BLp towards the memory cell transistors MT that are arranged in the nearest position of the source line SL. Therefore, the drain of the memory cell transistor MT that is connected to the word line WL0 is connected to the source of the select transistor ST1 and the source of the memory cell transistor MT that is connected to the word line WLq is connected to the drain of the select transistor ST2.

Each of the word lines WL0 to WLq is commonly connected to the control gate electrodes of those of the memory cell transistors MT that are arranged on the same row in the NAND strings of the physical block. That is, the control gate electrodes of those of the memory cell transistors MT that are arranged on the same row in the block are connected to a corresponding one of the word lines WL. The (p+1) memory cell transistors MT connected to the same word line WL are dealt with as one page (physical page) and data write and data read operations are performed for each physical page.

Further, the bit lines BL0 to BLq are each commonly connected to the drains of the select transistors ST1 in the blocks. That is, the NAND strings lying on the same column in a plurality of blocks are connected to a corresponding one of the bit lines BL.

With the embodiments, a difference in the transition time at the rise time and at the fall time of an input signal can be made small.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a first level shifter that includes:
      a first transistor of a first channel type having a source terminal connected to a power source voltage supply node of a first power source system,
      a second transistor of the first channel type having a source terminal connected to the power source voltage supply node of the first power source system, a drain terminal connected to a gate terminal of the first transistor and a gate terminal connected to a drain terminal of the first transistor,
      a third transistor of a second channel type having a drain terminal connected to the drain terminal of the first transistor, a source terminal connected to a ground voltage supply node and a gate terminal to which a first signal of a second power source system is input, and
      a fourth transistor of the second channel type having a drain terminal connected to the drain terminal of the second transistor, a source terminal connected to the ground voltage supply node and a gate terminal to which an inversion signal of the first signal is input, and a second level shifter that includes:
a fifth transistor of the first channel type having a source terminal connected to the power source voltage supply node of the first power source system,
a sixth transistor of the first channel type having a source terminal connected to the power source voltage supply node of the first power source system, a drain terminal connected to a gate terminal of the fifth transistor and a gate terminal connected to a drain terminal of the fifth transistor,
a seventh transistor of a second channel type having a drain terminal connected to the drain terminal of the fifth transistor, a source terminal connected to the ground voltage supply node and a gate terminal to which a second signal of the second power source system is input, and
an eighth transistor of the second channel type having a drain terminal connected to the drain terminal of the sixth transistor, a source terminal connected to the ground voltage supply node and a gate terminal to which a signal of a common drain terminal of the drain terminal of the second transistor and the drain terminal of the fourth transistor is input.

2. The semiconductor integrated circuit according to claim 1, wherein driving abilities of the first, second, fifth and sixth transistors are substantially equal and driving abilities of the third, fourth, seventh and eighth transistors are substantially equal.

3. The semiconductor integrated circuit according to claim 1, further comprising an inverter to which the power source voltage of the second power source system is applied and the first signal is input and that outputs the second signal.

4. The semiconductor integrated circuit according to claim 1, wherein the power source voltage of the first power source system is higher than the power source voltage of the second power source system.

5. The semiconductor integrated circuit according to claim 1, wherein the first level shifter further includes:
a ninth transistor of the first channel type having a source terminal connected to the power source voltage supply node of the first power source system, a drain terminal connected to the source terminal of the first transistor and a gate terminal to which the first signal is input, and
a tenth transistor of the first channel type having a source terminal connected to the power source voltage supply node of the first power source system, a drain terminal connected to the source terminal of the second transistor and a gate terminal to which the second signal is input, and the second level shifter further includes:
an eleventh transistor of the first channel type having a source terminal connected to the power source voltage supply node of the first power source system, a drain terminal connected to the source terminal of the fifth transistor and a gate terminal to which the second signal is input, and
a twelfth transistor of the first channel type having a source terminal connected to the power source voltage supply node of the first power source system, a drain terminal connected to the source terminal of the sixth transistor and a gate terminal to which a non-inverted signal of the first signal is input.

6. The semiconductor integrated circuit according to claim 5, wherein driving abilities of the ninth, tenth, eleventh and twelfth transistors are substantially equal.

7. The semiconductor integrated circuit according to claim 5, further comprising:
a first inverter to which a power source voltage of the second power source system is applied and the first signal is input and that outputs the second signal, and
a second inverter to which the power source voltage of the second power source system is applied and the second signal is input and that outputs a non-inverted signal of the first signal.

8. A semiconductor integrated circuit comprising:
a level shift circuit that includes:
a first level shifter that includes a plurality of transistors and is connected to a power source voltage supply node of a first power source system and to which a first signal of a second power source system and a level inversion signal of the first signal of the second power source system are input, and
a second level shifter that includes a plurality of transistors and is connected to the power source voltage supply node of the first power source system and to which the level inversion signal of the first signal of the second power source system and an output signal of the first level shifter are input,
wherein the first and second level shifters have substantially the same circuit configuration and driving abilities of corresponding ones of the transistors in the first and second level shifters are substantially set equal.

9. The semiconductor integrated circuit according to claim 8, further comprising an inverter to which a power source voltage of the second power source system is applied and the first signal is input and that outputs a level-inversion signal of the first signal.

10. The semiconductor integrated circuit according to claim 8, wherein the power source voltage of the first power source system is higher than the power source voltage of the second power source system.

11. The semiconductor integrated circuit according to claim 8, wherein the semiconductor integrated circuit is arranged on a memory chip and the level shift circuit is provided in a data input circuit of the memory chip.

12. The semiconductor integrated circuit according to claim 8, wherein the semiconductor integrated circuit is arranged on a memory chip and the level shift circuit is provided in a control signal input circuit of the memory chip.

13. The semiconductor integrated circuit according to claim 8, wherein the first level shifter includes:
a first transistor of a first channel type having a source terminal connected to a power source voltage supply node of a first power source system,
a second transistor of the first channel type having a source terminal connected to the power source voltage supply node of the first power source system, a drain terminal connected to a gate terminal of the first transistor and a gate terminal connected to a drain terminal of the first transistor,
a third transistor of a second channel type having a drain terminal connected to the drain terminal of the first transistor, a source terminal connected to a ground voltage supply node and a gate terminal to which a first signal of a second power source system is input, and
a fourth transistor of the second channel type having a drain terminal connected to the drain terminal of the second transistor, a source terminal connected to the ground voltage supply node and a gate terminal of the third transistor and a gate terminal to which an inversion signal of the first signal is input, and the second level shifter includes:
a fifth transistor of the first channel type having a source terminal connected to a power source voltage supply node of a first power source system, a sixth transistor of the first channel type having a source terminal connected to the power source voltage supply node of the first power source system, a drain terminal connected to a gate terminal of the fifth transistor and a gate terminal connected to a drain terminal of the fifth transistor, a seventh transistor of the second channel type having a drain terminal connected to the drain terminal of the fifth transistor, a source terminal connected to a ground voltage supply node and a gate terminal to which an inversion signal of the first signal is input, and an eighth transistor of the second channel type having a drain terminal connected to the drain terminal of the sixth transistor, a source terminal connected to the ground voltage supply node and a gate terminal to which a signal of a common drain terminal of the drain terminal of the second transistor and the drain terminal of the fourth transistor is input.

14. The semiconductor integrated circuit according to claim 13, wherein the first level shifter further includes:
a ninth transistor of the first channel type having a source terminal connected to the power source voltage supply node of the first power source system, a drain terminal connected to the source terminal of the first transistor and a gate terminal to which the first signal is input, and a tenth transistor of the first channel type having a source terminal connected to the power source voltage supply node of the first power source system, a drain terminal connected to the source terminal of the second transistor and a gate terminal to which an inversion signal of the first signal is input, and the second level shifter further includes:
an eleventh transistor of the first channel type having a source terminal connected to the power source voltage supply node of the first power source system, a drain terminal connected to the source terminal of the fifth transistor and a gate terminal to which the inversion signal of the first signal is input, and a twelfth transistor of the first channel type having a source terminal connected to the power source voltage supply node of the first power source system, a drain terminal connected to the source terminal of the sixth transistor and a gate terminal to which a non-inverted signal of the first signal is input.

15. The semiconductor integrated circuit according to claim 14, wherein driving abilities of the first, second, fifth and sixth transistors are substantially equal, driving abilities of the third, fourth, seventh and eighth transistors are substantially equal and driving abilities of the ninth, tenth, eleventh and twelfth transistors are substantially equal.

16. The semiconductor integrated circuit according to claim 14, further comprising:

a first inverter to which a power source voltage of the second power source system is applied and the first signal is input and that outputs an inversion signal of the first signal, and a second inverter to which a power source voltage of the second power source system is applied and the inversion signal of the first signal is input and that outputs a non-inverted signal of the first signal.

17. A semiconductor integrated circuit comprising:
a first level shifter configured to shift a level of a first signal from a first power source system to a second power source system, and to output a signal;

a second level shifter configured to shift an inversion signal of the first signal from the first power source system to the second power source system by the signal output from the first level shifter;

the first level shifter comprising first transistors of a first channel type and second transistors of a second channel type, the first transistors having sources to which the second power source system is supplied, and having drains and gates which are cross-coupled, and the second transistors having drains which are coupled to drains of the first transistors, and having gates which are controlled by the first signal and the inversion signal, wherein the signal output from the first level shifter is derived from a node coupled to said drains; and the second level shifter comprising third transistors of the first channel type and fourth transistors of the second channel type, the third transistors having sources to which the second power source system is supplied, and having drains and gates which are cross-coupled, said fourth transistors having drains which are coupled to drains of the third transistors, and having gates which are controlled by the inversion signal and the signal output from the first level shifter.

18. The semiconductor integrated circuit according to claim 17, further comprising:
fifth transistors of the first channel type coupled between the sources of the first transistors and a node supplied with the second power source system; and sixth transistors of the first channel type coupled between the sources of the third transistors and a node supplied with the second power source system.

19. The semiconductor integrated circuit according to claim 17, wherein:
the first level shifter shifts level of the first signal by driving the second transistors of the second channel type by the first power source system: and the second level shifter shifts the inversion signal of the first signal by driving the fourth transistors of the second channel type, wherein the second power source system is higher than the first power source system, and the signal output from the first level shifter has the second power source system or the first power source system.

* * * * *